US012710446B2

(12) United States Patent
Han et al.

(10) Patent No.: US 12,710,446 B2
(45) Date of Patent: Aug. 18, 2026

(54) SOCKET FOR TESTING SEMICONDUCTOR DEVICE

(71) Applicant: Samsung Electronics Co., Ltd., Suwon-si (KR)

(72) Inventors: Sanguk Han, Suwon-si (KR); Jaekul Lee, Suwon-si (KR); Hyungsun Jang, Suwon-si (KR); Taehun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 358 days.

(21) Appl. No.: 18/497,401

(22) Filed: Oct. 30, 2023

(65) Prior Publication Data

US 2024/0142493 A1 May 2, 2024

(30) Foreign Application Priority Data

Oct. 31, 2022 (KR) ........................ 10-2022-0142859
Jan. 18, 2023 (KR) ........................ 10-2023-0007154

(51) Int. Cl.
*G01R 31/28* (2006.01)
*G01R 1/04* (2006.01)
*H10W 72/20* (2026.01)
*H10W 72/30* (2026.01)

(52) U.S. Cl.
CPC ....... *G01R 1/0466* (2013.01); *G01R 31/2863* (2013.01); *H10W 72/221* (2026.01); *H10W 72/342* (2026.01)

(58) Field of Classification Search
CPC ............ G01R 31/2896; G01R 31/2889; G01R 31/2886; G01R 31/2879; G01R 1/07314; G01R 1/0466
See application file for complete search history.

(56) References Cited

U.S. PATENT DOCUMENTS 5,006,792 A 4/1991 Malhi et al.
6,400,169 B1 * 6/2002 Hembree ............. G01R 1/0483 324/750.25
7,427,869 B2 * 9/2008 Cram ................. G01R 1/06722 324/756.07

(Continued)

FOREIGN PATENT DOCUMENTS

JP 5319442 B2 10/2013
JP 2019008989 A 1/2019

(Continued)

*Primary Examiner* — Tung X Nguyen
(74) *Attorney, Agent, or Firm* — Muir Patent Law, PLLC

(57) ABSTRACT

A socket for testing a semiconductor package includes a body having an internal space configured to accommodate a semiconductor package; and at least a first spacer on the body and positioned to contact a first surface of the semiconductor package when the semiconductor package is placed on the body. The body includes a lower socket portion provided with through-holes, configured through which to receive meter reading pins that contact external connection terminals of the semiconductor package, and an upper socket portion disposed above the lower socket portion, and the first spacer is disposed on a surface of the lower socket portion that faces the first surface of the semiconductor package when the semiconductor package is placed on the body.

19 Claims, 6 Drawing Sheets

(56) References Cited

U.S. PATENT DOCUMENTS

| | | | |
|---|---|---|---|
| 9,488,675 | B2 | 11/2016 | Lee |
| 2003/0025172 | A1 | 2/2003 | Grube et al. |

FOREIGN PATENT DOCUMENTS

| | | | |
|---|---|---|---|
| KR | 100486194 | B1 | 6/2005 |
| KR | 1020080070996 | A | 8/2008 |
| KR | 101037786 | B1 | 5/2011 |
| KR | 1020110074814 | A | 7/2011 |

* cited by examiner

SOCKET FOR TESTING SEMICONDUCTOR DEVICE

CROSS-REFERENCE TO RELATED APPLICATION(S)

This application claims the priority under 35 USC 119(a) to Korean Patent Application No. 10-2022-0142859 filed on Oct. 31, 2022 and Korean Patent Application No. 10-2023-0007154 filed on Jan. 18, 2023 in the Korean Intellectual Property Office, the entire disclosures of which are incorporated herein by reference.

BACKGROUND

Aspects of the present inventive concept relate to a socket for testing a semiconductor device.

When a biased highly accelerated stress test (biased HAST) of wafer level package (WLP) products is performed, continuous bad corrosion occurs in the socket for testing where the WLP products are installed. The bad corrosion occurs since an ionization environment is generated due to moisture penetrating into a narrow gap between the socket for testing and a bottom surface of the WLP product. For example, when a sulfur (S) component present in the socket for testing comes into contact with moisture, copper corrosion may occur on the surface of the WLP product.

Therefore, there is a need to develop a socket for testing that is used for a biased highly accelerated stress test (biased HAST) and that may not cause copper corrosion.

SUMMARY

Example embodiments provide a socket for testing capable of preventing copper corrosion from occurring.

According to example embodiments, a socket for testing a semiconductor package includes a body having an internal space configured to accommodate a semiconductor package; and at least a first spacer on the body and positioned to contact a first surface of the semiconductor package when the semiconductor package is placed on the body. The body includes a lower socket portion provided with through-holes, configured through which to receive meter reading pins that contact external connection terminals of the semiconductor package, and an upper socket portion disposed above the lower socket portion, and the first spacer is disposed on a surface of the lower socket portion that faces the first surface of the semiconductor package when the semiconductor package is placed on the body.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings.

Figure 1:
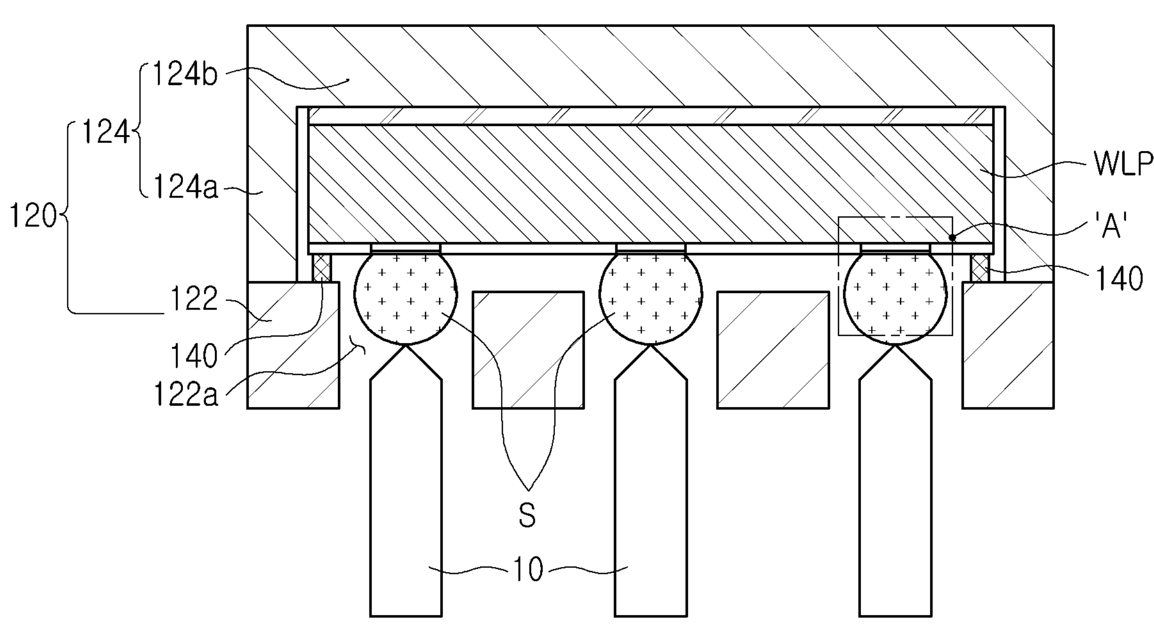
FIG. 1 is a configuration diagram illustrating a socket for testing according to an example embodiment.
Figure 2:
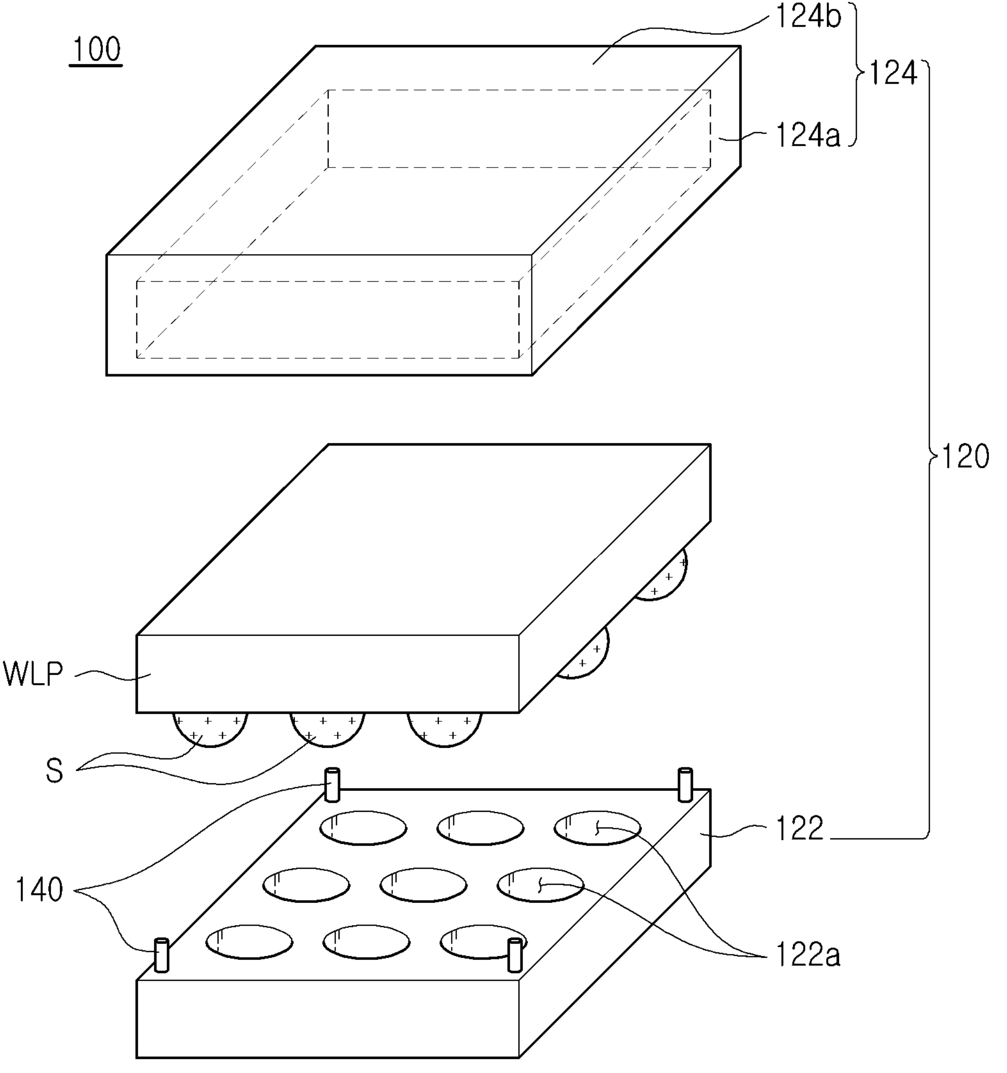
FIG. 2 is an exploded perspective view illustrating the socket for testing according to the example embodiment.
Figure 3:
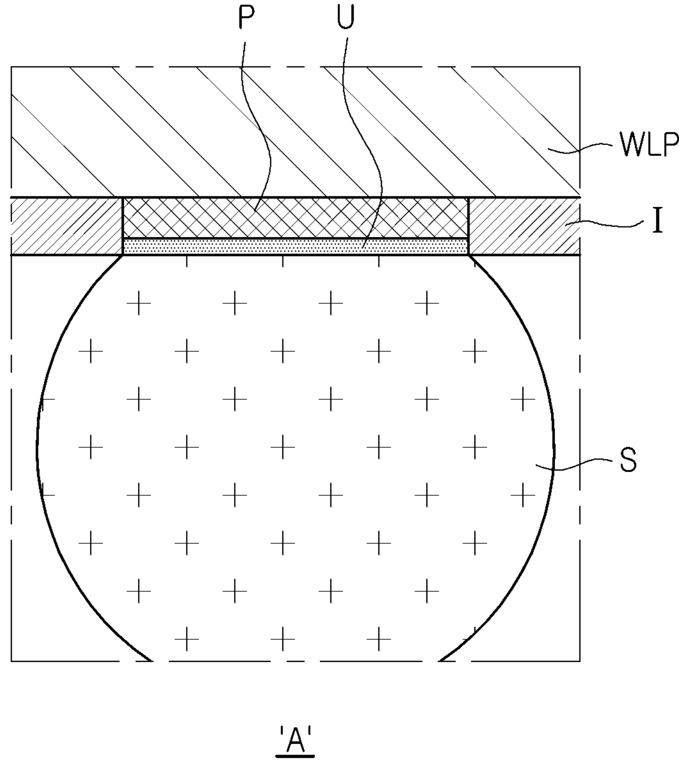
FIG. 3 is an enlarged view illustrating portion A of FIG. 1.

FIG. 1 is a configuration diagram illustrating a socket for testing according to an example embodiment, FIG. 2 is an exploded perspective view illustrating the socket for testing according to the example embodiment of FIG. 1, and FIG. 3 is an enlarged view illustrating portion A of FIG. 1.

Referring to FIGS. 1 to 3, a socket 100 for testing a semiconductor device according to an example embodiment includes a body 120 and a spacer 140. Certain items described in this specification will be described in the singular, but may be included in plural. For example, though a single spacer 140 may be discussed, as can be seen in the various figures, a plurality of spacers may be included.

The body 120 has an internal space in which a semiconductor device such as a wafer level package (WLP) is accommodated. Though described primarily in the context of wafer level packages (WLP), the socket 100 described herein may be used for other semiconductor packages as well. A semiconductor package refers to a semiconductor device including an integrated circuit chip covered with an encapsulant to form a package, and typically including solder balls or bumps as external connection terminals. The integrated circuit chip may be formed using a silicon wafer, for example. As an example of the socket 100, the body 120 may include a lower socket 122 and an upper socket 124. The lower socket 122 may also be referred to as a lower socket portion, lower body portion, or lower frame, and the upper socket 124 may also be referred to as an upper socket portion, upper body portion, or upper frame. The lower socket 122 may include a through-hole **122*a* through which a meter reading pin 10 that contacts the solder ball S provided in the wafer level package WLP penetrates. As an example, a plurality of through-holes 122*a* may be spaced apart from each other. In one embodiment, the through-holes 122*a* may have circular shapes, but the embodiments are not limited to this example. In addition, the through-holes 122*a* may be disposed to form a plurality of columns and rows. The through-hole 122*a* may have a larger diameter than the meter reading pin 10. The meter reading pin 10 is configured to be able to move up and down, so the meter reading pin 10 may enter and exit the through-hole 122*a*. The meter reading pin 10** may be made of a conductive material.

The upper socket 124 may be disposed above the lower socket 122. For example, during testing a semiconductor device such as a wafer level package WLP, the upper socket 124 may be disposed above the lower socket 122, and the upper socket may cover a top of the wafer level package WLP while the lower socket 122 is disposed below the wafer level package WLP. As an example, the upper socket 124 may include a side wall part **124*a* (i.e., side walls) connected to an edge of the lower socket 122 and a cover part 124*b* (i.e., a cover) disposed above the side wall part 124*a***.

The lower socket 122 and the upper socket 124 may be detachably coupled. However, the structure of the lower socket 122 and the upper socket 124 is not limited thereto, and the lower socket 122 and the upper socket 124 may have a structure in which one end portion of the upper socket 124 may rotate while hinged to the lower socket 122 to open and close the internal space formed by the upper socket 124 and the lower socket 122.

In addition, in the present example embodiment, the case where the upper socket 124 includes the side wall part 124*a* and the cover part 124*b* is described as an example, but it is not limited thereto. For example, the side wall part 124*a* may extend from the lower socket 122, and the upper socket 124 may include only a plate-shaped cover part 124*b*.

As an example, an elastic part (not illustrated) may be disposed between the lower socket 122 and the upper socket 124, and the upper socket 124 and the lower socket 122 may be disposed at a certain location when no external force is applied to the elastic part.

The spacer 140 is installed on the body 120 to be attached to the body, and is positioned to contact one surface of the wafer level package (WLP) during testing. As an example, the spacer 140 may be disposed on one surface of the lower socket 122, for example, on the upper surface. The spacer 140 may be attached to the lower socket 122, for example, using an adhesive material, and/or by using a physical connector such as a screw or pillar penetrating the body 120. In addition, the plurality of spacers 140 may be spaced apart from each other. For example, a spacer 140 may be disposed at four corners of the upper surface of the lower socket 122, as depicted in FIG. 2. The spacer 140 may have, for example, a cylindrical column shape. However, the shape of the spacer 140 is not limited thereto, and the spacer 140 may have a polygonal column shape. As an example, the spacer 140 may be formed of a synthetic resin material, a non-metallic material, or the like that may withstand high temperature and high humidity environments. In some embodiments, the spacer 140 may have a height above a surface of the lower socket 122 of 100 μm or more, and therefore, the spacers 140 separate the upper surface of the lower socket 122 from the lower surface of the wafer level package WLP by a distance of at least 100 μm. Accordingly, it is possible to reduce copper corrosion. Describing this in more detail, as illustrated in FIG. 3 in more detail in the wafer level package (WLP), a connection pad P, and an under bump metallurgy (UBM) disposed between a solder ball S and the connection pad P may be provided. When a biased HAST is performed on the wafer level package (WLP), moisture may be brought into contact with the UBM layer U in the existing socket for testing structure. In addition, an insulating layer I (e.g., a photosensitive polyimide layer) may be disposed around the connection pad P and the UBM layer U. In addition, a water layer is formed in a gap between the existing socket for testing (not illustrated in FIG. 3) and the wafer level package (WLP) by a capillary effect. In this case, there may be a problem in that copper corrosion occurs in the socket for testing and the wafer level package due to contact with a sulfur component contained in the socket for testing for several minutes. The sulfur component contained in the socket for testing is contained in the socket for testing during the previous process (e.g., cleaning process).

However, according to the socket 100 for test according to example embodiments, since a height of a space between the wafer level package (WLP) and the lower socket 122 provides a gap between the socket 100 surface and the surface of the wafer level package (WPL), such as a gap of 100 μm or more due to the spacer 140, the capillary effect may be suppressed, which may reduce or remove the moisture layer from being formed. Accordingly, it is possible to prevent the copper corrosion from occurring in the socket 100 during testing of the wafer level package (WLP).

As described above, the spacer 140 may prevent the copper corrosion from occurring in the socket 100 during testing of the wafer level package WLP.

Figure 4:
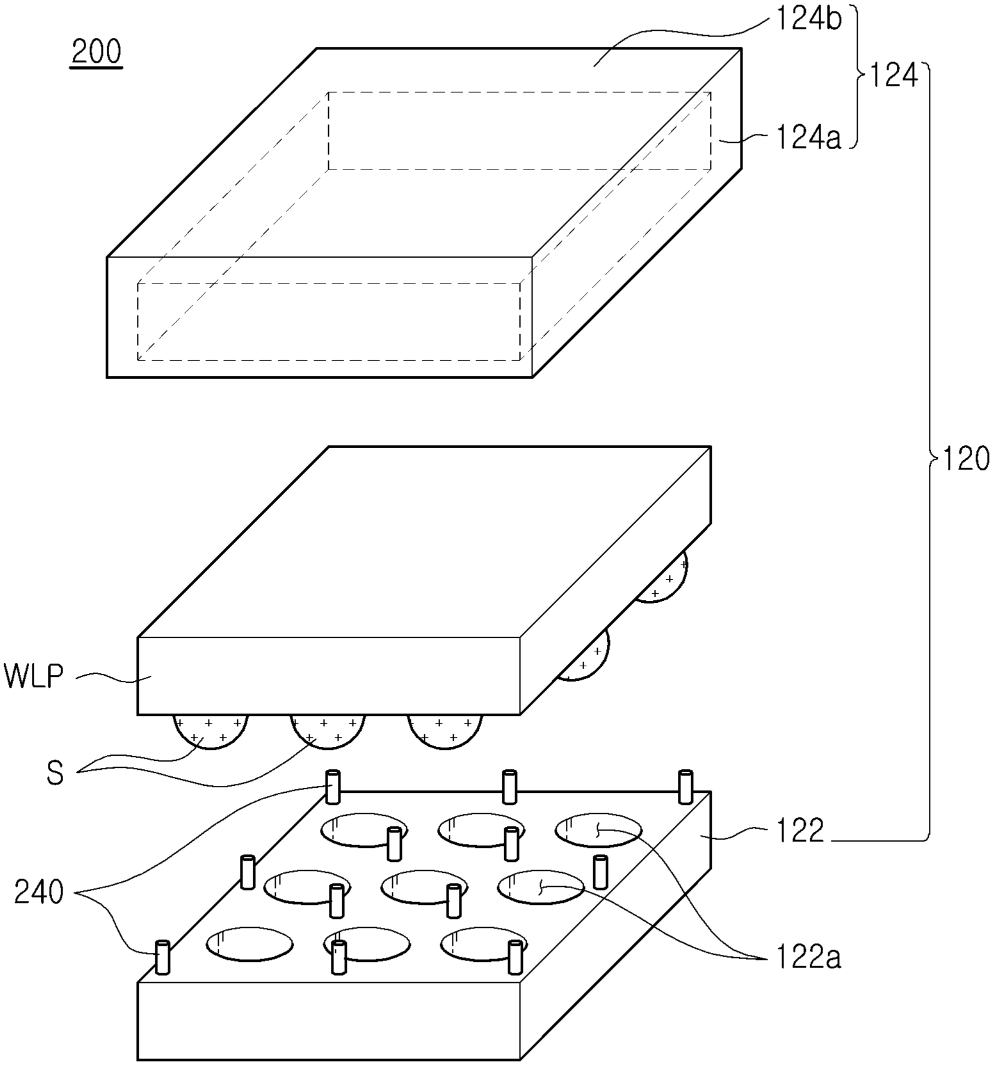
FIG. 4 is an exploded perspective view illustrating the socket for testing according to the example embodiment.

FIG. 4 is an exploded perspective view illustrating the socket for testing according to an example embodiment.

Since the body 120 is substantially the same as the component described above, a detailed description thereof will be omitted and replaced by the above description.

Referring to FIG. 4, a spacer 240 is installed on the body 120 and is in contact with one surface of the wafer level package (WLP) during testing. As an example, the spacer 240 may be disposed on one surface of the lower socket 122. In addition, the plurality of spacers 240 may be spaced apart from each other. For example, spacers 240 may be disposed at four corners of the upper surface of the lower socket 122, as well as at other locations on the upper surface of the lower socket 122, such as along the edges of the lower socket 122 and between openings 122*a* in the lower socket 122. The spacers 240 may have, for example, a cylindrical or a polygonal column shape. In addition, the spacers 240 may have a height of 100 μm or more. Accordingly, since the capillary effect may be suppressed to prevent the moisture layer from being formed, it is possible to prevent the copper corrosion from occurring in the socket during testing of the wafer level package (WLP).

As discussed above, in addition to the spacers being formed at four corners of the lower socket 122, the spacers 240 may be disposed in an area where the through-holes 122*a* of the lower socket 122 are not formed and along edges of the lower socket 122.

Figure 5:
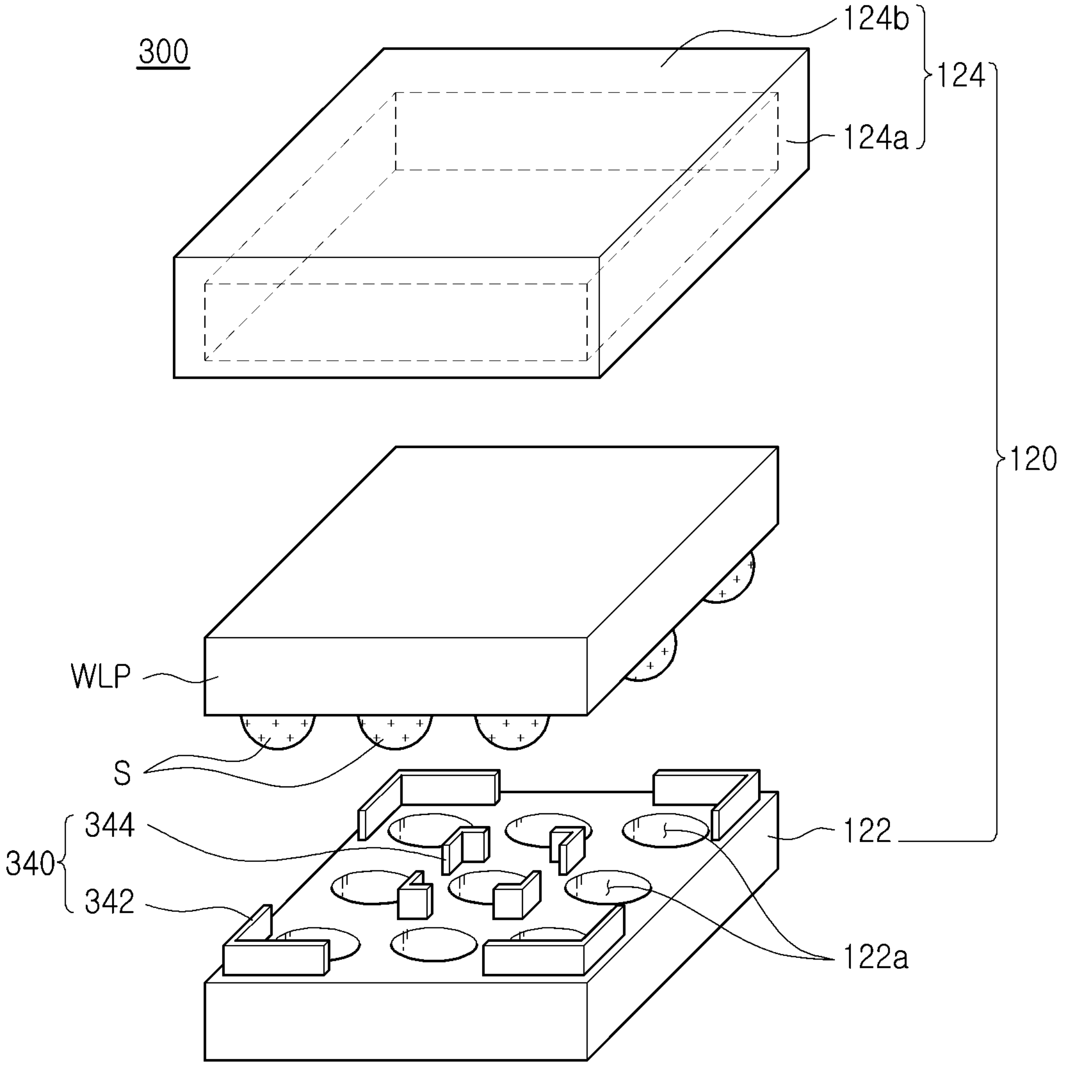
FIG. 5 is an exploded perspective view illustrating the socket for testing according to the example embodiment.

FIG. 5 is an exploded perspective view illustrating the socket for testing according to an example embodiment.

Since the body 120 is substantially the same as the component described above, a detailed description thereof will be omitted and replaced by the above description.

Referring to FIG. 5, a spacer 340 is installed on the body 120 and is in contact with one surface of the wafer level package (WLP). As an example, the spacer 340 may be disposed on one surface of the lower socket 122. In addition, the plurality of spacers 340 may be spaced apart from each other. For example, the spacers 340 may include first spacers 342 disposed at edges of an upper surface of the lower socket 122 and disposed at corner sides of a rectangular strip shape, and second spacers 344 disposed at a central portion of the upper surface of the lower socket 122 and disposed at corner sides of a rectangular strip shape. As an example, the spacer 340 may have a height of 100 μm or more. Accordingly, since the capillary effect may be suppressed to prevent the moisture layer from being formed, it is possible to prevent the copper corrosion from occurring in the socket for testing and the wafer level package (WLP).

Figure 6:
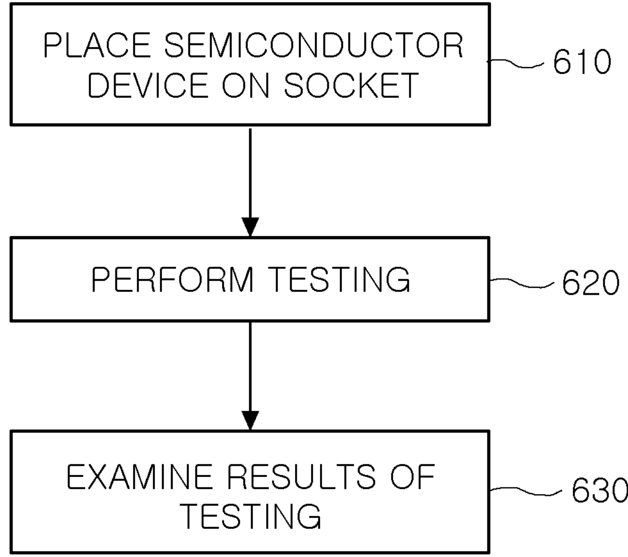
FIG. 6 is a flow chart showing a method of testing a semiconductor package using a socket, according to an example embodiment.

FIG. 6 is a flow chart showing a method of testing a semiconductor package using a socket, according to an example embodiment. The socket mentioned in the method of FIG. 6 may be any of the sockets discussed in connection with FIGS. 1-5 above. In step 610, a semiconductor device, such as a wafer level package, is placed on a surface of a socket. More specifically, the semiconductor device may be placed on spacers formed on a top surface of a bottom socket portion of the socket. In step 620, testing, such as biased HAST testing, is performed on the semiconductor device. For example, the socket and semiconductor device may be located in a chamber configured to perform testing on the semiconductor device, and a biased HAST test may be performed. In step 630, results of the testing are examined and may be stored. The results may be used to further adjust a design and/or manufacturing process of the semiconductor device.

According to various aspects of the above embodiments, it is possible to provide a socket for testing a semiconductor device, capable of preventing copper corrosion from occurring. For example, copper corrosion may be particularly prevented for wafer level packages or other packages that would in conventional systems fit into a socket that results in a capillary effect pulling in water that causes certain corrosion. By preventing the capillary effect using the spacers such as disclosed herein, corrosion can be likewise prevented.

Various and beneficial advantages and effects of the present inventive concept are not limited to the above description, and may be more easily understood in the course of describing the specific example embodiments of the present inventive concept.

While example embodiments have been illustrated and described above, it will be apparent to those skilled in the art that modifications and variations could be made without departing from the scope of the present claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

What is claimed is:

1. A socket for testing a semiconductor package, the socket comprising:

a body having an internal space configured to accommodate a wafer level package; and a plurality of spacers on the body and positioned to contact a first surface of the wafer level package when the wafer level package is placed on the body, wherein the body includes a lower socket portion provided with through-holes, configured through which to receive meter reading pins that contact external connection terminals of the wafer level package, and an upper socket portion disposed above the lower socket portion, wherein the plurality of spacers are disposed on a first surface of the lower socket portion that faces the first surface of the wafer level package when the wafer level package is placed on the body, and wherein a first surface of the upper socket portion faces the first surface of the lower socket portion so that the plurality of spacers are between the first surface of the upper socket portion and the first surface of the lower socket portion.

2. The socket of claim 1, wherein the plurality of spacers are disposed spaced apart from each other on the first surface of the lower socket portion.

3. The socket of claim 2, wherein the plurality of spacers are disposed at corners of the first surface of the lower socket portion.

4. The socket of claim 1, wherein the plurality of spacers each have a height above the first surface of the lower socket portion of 100 μm or more.

5. The socket of claim 1, wherein the lower socket portion and the upper socket portion are detachably configured.

6. The socket of claim 1, wherein when the wafer level package is tested, the external connection terminals are disposed in the through-holes and contact the meter reading pins.

7. The socket of claim 1, wherein the plurality of spacers are disposed spaced apart from each other on the first surface of the lower socket portion, and wherein the plurality of spacers are disposed at a central portion and at edges of the first surface of the lower socket portion.

8. The socket of claim 1, wherein the upper socket portion includes a sidewall part connected to an edge of the lower socket portion and a cover part disposed above the sidewall part.

9. The socket of claim 1, wherein the lower socket portion has a plate shape.

10. The socket of claim 1, wherein the plurality of spacers each have a cylindrical or polygonal column shape.

11. The socket of claim 1, wherein the wafer level package is provided with an under bump metallurgy (UBM) layer disposed between connection pads and the external connection terminals.

12. The socket of claim 1, wherein the plurality of spacers have a strip shape.

13. The socket of claim 12, wherein the plurality of spacers include a first spacer disposed at an edge of the first surface of the lower socket portion and disposed at a corner of a rectangular strip shape, and a second spacer disposed at a central portion of the first surface of the lower socket portion and disposed at a corner of a rectangular strip shape.

14. A socket for testing a semiconductor package, the socket comprising:

a body including a lower socket portion having a lower surface and an upper surface opposite the lower surface and provided with a through-hole through which, during testing, a meter reading pin in contact with a solder ball provided in a wafer level package penetrates, and an upper socket portion having an upper surface and having a lower surface facing the upper surface of the lower socket portion, the upper socket portion disposed above the lower socket portion; and a plurality of spacers installed on the upper surface of the lower socket portion, to be disposed between the upper surface of the lower socket portion and the lower surface of the upper socket portion, and positioned to contact one surface of the wafer level package during testing, wherein the plurality of spacers are disposed spaced apart from each other on the upper surface of the lower socket portion, and wherein each spacer has a cylindrical or polygonal column shape.

15. The socket of claim 14, wherein the plurality of spacers are disposed at an edge of the upper surface of the lower socket portion.

16. The socket of claim 14, wherein the plurality of spacers include a first spacer disposed at a central portion of the upper surface of the lower socket portion and a second spacer disposed at an edge of the upper surface of the lower socket portion.

17. A socket for testing a semiconductor package, the socket comprising:

a body having an internal space configured to accommodate a semiconductor package; and at least a first spacer on the body and positioned to contact a first surface of the semiconductor package when the semiconductor package is placed on the body, wherein the body includes a lower socket portion provided with through-holes, configured through which to receive meter reading pins that contact external connection terminals of the semiconductor package, and an upper socket portion disposed above the lower socket portion, and wherein the first spacer is disposed on an upper surface of the lower socket portion that faces a lower surface of the upper socket portion and faces the first surface of the semiconductor package when the semiconductor package is placed on the body.

18. The socket of claim 17, wherein the first spacer is one of a plurality of spacers disposed on the upper surface of the lower socket portion, which spacers separate the upper surface of the lower socket portion from the first surface of the semiconductor package by a distance of at least 100 μm.

19. The socket of claim 17, wherein the external connection terminals are solder balls or bumps.

* * * * *